US011196162B2

(12) United States Patent
Jouanlanne

(10) Patent No.: US 11,196,162 B2
(45) Date of Patent: Dec. 7, 2021

(54) PATCH ANTENNA HAVING TWO DIFFERENT RADIATION MODES WITH TWO SEPARATE WORKING FREQUENCIES, DEVICE USING SUCH AN ANTENNA

(71) Applicant: SIGFOX, Labege (FR)

(72) Inventor: Cyril Jouanlanne, Toulouse (FR)

(73) Assignee: SigFox

( * ) Notice: Subject to any disclaimer, the term of this patent is extended or adjusted under 35 U.S.C. 154(b) by 34 days.

(21) Appl. No.: 16/635,831

(22) PCT Filed: Aug. 17, 2018

(86) PCT No.: PCT/EP2018/072288
§ 371 (c)(1),
(2) Date: Jan. 31, 2020

(87) PCT Pub. No.: WO2019/034760
PCT Pub. Date: Feb. 21, 2019

(65) Prior Publication Data
US 2020/0227829 A1 Jul. 16, 2020

(30) Foreign Application Priority Data
Aug. 18, 2017 (FR) ...................................... 1757731

(51) Int. Cl.
*H03M 1/38* (2006.01)
*H01Q 5/335* (2015.01)
*H01Q 5/328* (2015.01)
*H01Q 9/04* (2006.01)

(52) U.S. Cl.
CPC ............ *H01Q 5/335* (2015.01); *H01Q 5/328* (2015.01); *H01Q 9/0407* (2013.01)

(58) Field of Classification Search
CPC ...... H01Q 5/335; H01Q 5/328; H01Q 9/0407; H01Q 5/314; H01Q 9/0421; H01Q 1/3275
USPC ..................................................... 343/700 M
See application file for complete search history.

(56) References Cited

U.S. PATENT DOCUMENTS 6,720,935 B2 * 4/2004 Lamensdorf ........... H01Q 1/362 343/700 MS
8,354,972 B2 * 1/2013 Borja ..................... H01Q 5/378 343/797
8,952,857 B2 * 2/2015 Diaz .................. H01Q 13/0225 343/772
2003/0114118 A1 * 6/2003 Fukushima .............. H01Q 1/48 455/82
2003/0117325 A1 * 6/2003 Jo .......................... H01Q 1/243 343/702

(Continued)

FOREIGN PATENT DOCUMENTS

WO 03041216 5/2003

*Primary Examiner* — Jean B Jeanglaude
(74) *Attorney, Agent, or Firm* — Perman & Green, LLP

(57) ABSTRACT

An antenna including a ground plane, a metal plate arranged facing the ground plane, and a supply wire for connecting the plate to a generator or a receiver, such that the antenna has a first resonance frequency in a patch antenna mode. The antenna further includes a ground wire connecting the plate to the ground plane, and a capacitive element arranged in series with the ground wire between the supply wire and the ground plane, such that the antenna also has a second resonance frequency in a wire-plate antenna mode.

13 Claims, 6 Drawing Sheets

(56) References Cited

U.S. PATENT DOCUMENTS

| | | | | |
|---|---|---|---|---|
| 2004/0125033 | A1* | 7/2004 | Yuanzhu | H01Q 9/36<br>343/702 |
| 2007/0200766 | A1 | 8/2007 | McKinzie, III et al. | |
| 2010/0171675 | A1* | 7/2010 | Borja | H01Q 9/0414<br>343/798 |
| 2012/0038520 | A1* | 2/2012 | Cornwell | H01Q 1/24<br>343/702 |
| 2012/0319922 | A1 | 12/2012 | Fuchs et al. | |
| 2013/0120211 | A1* | 5/2013 | Zhang | H01Q 1/243<br>343/841 |
| 2014/0292587 | A1 | 10/2014 | Yarga et al. | |
| 2019/0393729 | A1* | 12/2019 | Contopanagos | H01Q 21/08 |

* cited by examiner

PATCH ANTENNA HAVING TWO DIFFERENT RADIATION MODES WITH TWO SEPARATE WORKING FREQUENCIES, DEVICE USING SUCH AN ANTENNA

CROSS REFERENCE TO RELATED APPLICATIONS

This application is a National Stage of International Application No. PCT/EP2018/072288, having an International Filing Date of 17 Aug. 2018, which designated the United States of America, and which International Application was published under PCT Article 21(2) as WO Publication No. 2019/034760 A1, which claims priority from and the benefit of French Patent Application No. 1757731, filed on 18 Aug. 2017, the disclosures of which are incorporated herein by reference in their entireties.

BACKGROUND

1. Field

The present disclosure relates to the field of antennas. An antenna is a device allowing to radiate (emitter) or to receive (receiver) electromagnetic waves. Namely, the disclosure relates to an antenna, the structure of which allows to radiate or to receive radioelectric waves at two distinct working frequencies according to two different radiation modes and with particularly advantageous performance.

2. Brief Description of Related Developments

In the field of the compact antennas used for telecommunications, the antennas known to a person skilled in the art under the name "patch antenna" are already known. These antennas are also known under the name of "printed antenna".

Such an antenna consists of a radiating element corresponding to a metal plate of any given shape (rectangular, circular, or other more elaborate shapes) generally deposited on the surface of a dielectric substrate that has on the other face a conductive plane, or ground plane. The dielectric substrate, which substantially acts as a mechanical support for the radiating element, can be replaced by a honeycomb structure, the behaviour of which is close to that of the air, or also be eliminated if the mechanical retention of the radiating element can be ensured by other means. The power supply of the antenna is generally carried out via a power supply wire consisting of a coaxial probe which passes through the ground plane and the substrate and is connected to the radiating element, that is to say to the plate.

A patch antenna has, however, the disadvantage of having relatively large dimensions, approximately half the length of the desired working wavelength. Indeed, it can be considered at first glance that a patch antenna with a rectangular plate behaves like a cavity, the various discrete resonance frequencies of which correspond to known modes dependant on the dimensions of the plate. In particular, for a mode called "fundamental" the antenna enters into resonance at a frequency, half the wavelength of which corresponds to the length of the cavity. Thus, the lower the desired working frequencies, and the larger the dimensions of the radiating element must be in order for at least one of the resonance frequencies of the cavity to coincide with the working frequency.

To overcome this problem and reduce the size of the antennas, antennas are also known that are known to a person skilled in the art by the name of "wire-plate antenna". With respect to a patch antenna, a wire-plate antenna has at least one additional conductive wire connecting the plate to the ground plane. This is an active ground-return wire radiating at the working frequency in question.

Such a wire-plate antenna is home to two resonance phenomena, one relative to a resonance of the series type implementing all of the elements forming the structure of the antenna, and the other relative to a resonance of the parallel type implementing only the elements belonging to the ground wire and to the capacitor formed by the plate (also sometimes called "capacitive roof") and the ground plane. This is why the term "double resonance" is sometimes used for the antennas of the wire-plate type. The resonance called parallel caused by the ground-return wire of a wire-plate antenna occurs at a frequency lower than that of the fundamental resonance frequency of the cavity type of a patch antenna. Thus, for given plate dimensions, a wire-plate antenna has a working frequency lower than a patch antenna.

It should be noted that the operation of a wire-plate antenna is very different from the operation of a patch antenna. Indeed, the resonance, mentioned for a patch antenna is of the electromagnetic type: resonance of a cavity formed by the ground plane, the plate and the four imaginary "magnetic walls" connecting the four edges of the plate to the ground plane. As for the resonance of a wire-plate antenna, it is of the electric type: the resonating elements are localised, comparable to electric components.

It is, however, sometimes desirable to have an antenna that is capable of operating at a plurality of distinct working frequencies, and with different radiation modes, in order to satisfy various functions. These distinct working frequencies can for example belong to discontinuous frequency bands sometimes distant by several hundred megahertz from one another.

For this purpose, it is known to combine a plurality of antennas in a single structure. For example, it is known to superimpose a plurality of antennas of the wire-plate type, or to superimpose an antenna of the patch type and an antenna of the wire-plate type, in order to obtain an antenna behaviour that would be equivalent to that of a plurality of distinct antennas. These solutions have, however, several disadvantages, namely a bulk of the antenna, a mechanical complexity that increases its manufacturing cost, as well as difficulties in adapting the antenna to the various working frequencies, which leads to degraded performance of the antenna.

SUMMARY

The goal of the present disclosure is to overcome all or a part of the disadvantages of the prior art, namely those disclosed above.

For this purpose, and according to a first aspect, the present disclosure relates to an antenna comprising a ground plane, a metal plate arranged facing said ground plane, a power supply wire allowing to connect said plate to a generator or a receiver, a ground-return wire connecting the plate to the ground plane, as well as a capacitive element arranged in series with the ground-return wire between the power supply wire and the ground plane. The ground-return wire is arranged substantially perpendicularly to the plate and to the ground plane and it is positioned substantially in the middle of the plate.

With such arrangements, the antenna has not only a resonance in patch antenna mode (that is to say a cavity resonance of the electromagnetic type) at a first working frequency, but also a resonance in wire-plate antenna mode (that is to say a resonance of the electric type) at a second working frequency lower than the first working frequency. The ground-return wire is an element radiating at the second working frequency. A particular radiation mode corresponds to each of these two resonances. The capacitive element allows namely to optimise the radiation power of the antenna as well as its adaptation in terms of impedance to the two working frequencies in question.

In specific aspects of the disclosure, the radiation of the antenna at the first working frequency is maximum in a direction perpendicular to the plate, and the radiation of the antenna at the second working frequency is an omnidirectional radiation maximum in a direction parallel to the ground plane.

In specific aspects, the disclosure can further comprise one or more of the following features, taken alone or according to all the technically possible combinations.

In specific aspects of the disclosure, the plate of the antenna is a rectangular plate, two opposite angles of the same diagonal of which are truncated so that the antenna has a circular polarisation at the working frequency.

In specific aspects of the disclosure, the capacitive element is a discrete electronic component.

In specific aspects of the disclosure, the capacitive component has a controllable capacitive value.

In specific aspects of the disclosure, the capacitive element has two electrodes, including one electrode that is formed by a metal plate located at an end of the ground-return wire and arranged facing the plate of the antenna or the ground plane.

In specific aspects of the disclosure, the metal plate of the capacitive element is located at the end of the ground-return wire near the plate of the antenna, so that the other electrode is formed by the plate of the antenna.

In specific aspects of the disclosure, a slot is made in the plate of the antenna, so that said slot completely surrounds the point of connection between the ground-return wire and the plate, and the capacitive element comprises two electrodes, including one electrode that is formed by a part of the plate of the antenna that is outside of the contour formed by the slot, and the other electrode is formed by another part of the plate of the antenna that is inside said contour formed by the slot.

In specific aspects of the disclosure, at least one of the ground-return and power supply wires is a metal strip cut out of the antenna plate.

In specific aspects of the disclosure, the distance between the power supply wire and the ground-return wire is greater than one tenth of the wavelength of the second working frequency.

According to a second aspect, the disclosure relates to an emission device comprising an antenna according to any one of the preceding aspects and a generator connected to the power supply wire, adapted to forming an electric signal at the first working frequency and/or at the second working frequency.

According to a third aspect, the disclosure relates to a receiver device comprising an antenna according to any one of the preceding aspects of the disclosure and a receiver connected to the power supply wire, adapted to receiving an electric signal at the first working frequency and/or at the second working frequency.

According to a fourth aspect, the disclosure relates to a transceiver device comprising an antenna according to any one of the preceding aspects of the disclosure, configured to receive a signal at the first working frequency comprising geolocation information emitted by a satellite communication system and to emit to a terrestrial wireless communication system a signal at the second working frequency comprising the geographic position of said device.

BRIEF DESCRIPTION OF THE DRAWINGS

The disclosure will be better understood upon reading the following description, given as an example that is in no way limiting, and made in reference to FIGS. 1 to 15 which show.

DETAILED DESCRIPTION

Figure 1:
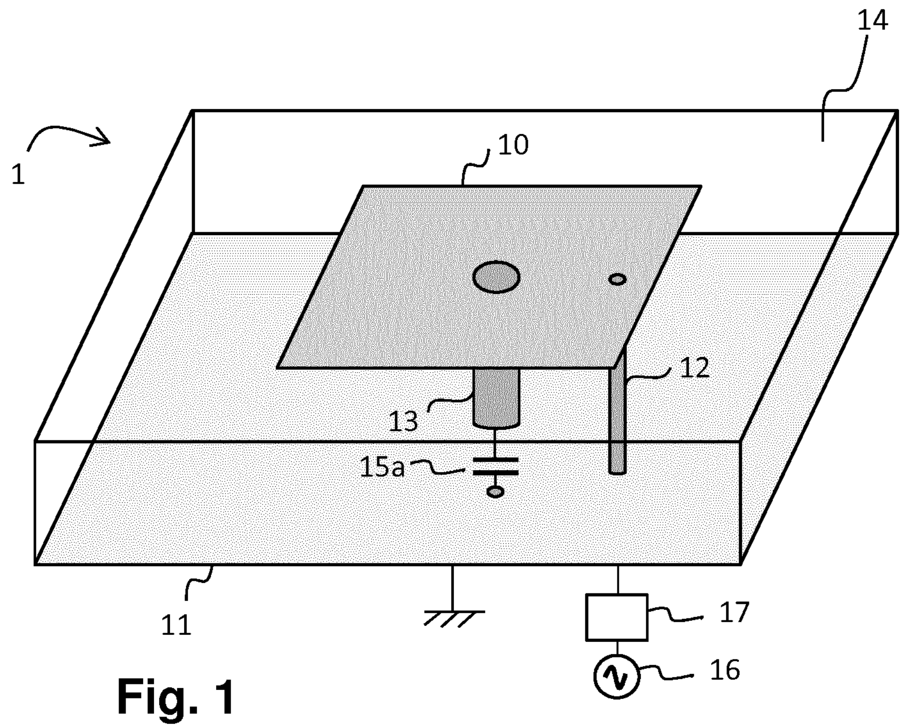
FIG. 1: a diagram, according to a perspective view, of a first aspect of an antenna according to the disclosure.

As indicated above, the present disclosure relates to an antenna 1, the structure of which allows to radiate or to receive electromagnetic waves at two distinct working frequencies according to two different radiation modes and with particularly advantageous performance.

In the rest of the description, for example and in a manner that is in no way limiting, the case is considered in which such an antenna 1 is integrated into a smart object intended to be placed for example on the roof of a motor vehicle and configured to receive a signal from a satellite geolocation system (also designated in English by the acronym GNSS for Global Navigation Satellite System), for example such as the GPS system (Global Positioning System), in order to determine its geographic position, and to transmit it, optionally accompanied by other information, to another wireless communication system for example such as an access network of the “Internet of Things” type, or IoT (English acronym for “Internet Of Things”).

To receive a signal from a satellite geolocation system, the antenna 1 must preferably have a high gain in a vertical direction 18 and upwards with respect to the roof of the vehicle at the working frequency of said geolocation system. If the GPS system is considered for example, the working frequency, that is to say the frequency of the radioelectric signals emitted by the GPS satellites, is approximately 1575 MHz. Thus, the polarisation used by the GPS system, that is to say the polarisation of the electric field of the wave emitted by an antenna of a GPS satellite, is a right-hand circular polarisation, called RHCP (English acronym for Right Hand Circular Polarization).

To transmit information to a wireless communication system of the IoT type, it is however advantageous for the antenna 1 to have, at the working frequency of said communication system, an omnidirectional gain that is maximum in a horizontal plane substantially parallel to the roof of the vehicle. Indeed, the base stations of an access network of such a wireless communication system are generally located on the sides with respect to the vehicle, and not above it. In the rest of the description, for example and in a non-limiting manner, the case is considered of an ultra-narrowband wireless communication system. “Ultra-narrowband” (“Ultra Narrow Band” or UNB in the Anglo-Saxon literature), means that the instantaneous frequency spectrum of the radioelectric signals emitted has a frequency width of less than two kilohertz, or even less than one kilohertz. Such UNB wireless communication systems are particularly adapted for applications of the IoT type. They can for example use the ISM (acronym for “Industrial, Scientific and Medical”) frequency band located around 868 MHz in Europe, or the ISM frequency band located around 915 MHz in the United States. A rectilinear polarisation is generally used in such systems.

Thus, in the rest of the description, the case is considered in which the antenna 1 according to the disclosure operates at two distinct working frequencies: a first working frequency close to 1575 MHz corresponding to the frequency of the GPS system, and a second working frequency located in an ISM band supported by the wireless communication system of the IoT type in question, for example the 868 MHz band or the 915 MHz band.

FIG. 1 schematically shows, according to a perspective view, a first aspect of such an antenna. In the example illustrated by FIG. 1, the antenna 1 comprises a first radiating element in the form of a metal plate 10 having a square shape. According to other examples, the plate 10 could be rectangular, hexagonal, circular, or of another given shape.

The plate 10 is disposed facing a ground plane 11. In the rest of the description, it is considered in a non-limiting manner that the plate 10 is flat. Nothing, however, excludes, according to other examples, having a non-flat plate 10. Moreover, it is considered that the plate 10 is disposed horizontally and in a manner substantially parallel with respect to the ground plane 11. According to other alternative examples, the plate 10 can be slightly inclined with respect to the ground plane 11. The distance separating the plate 10 from the ground plane 11 is much smaller than the dimensions of the plate 10 and the wavelengths of the working frequencies of the antenna. For example this distance is at least less than one tenth of the wavelength of the first working frequency. The two metal surfaces corresponding to the plate 10 and to the ground plane 11 can for example be disposed on either side of a dielectric substrate 14 that thus acts as a mechanical support. In other examples, the dielectric substrate 14 can be replaced by a honeycomb structure, the behaviour of which is close to that of the air, or it can be eliminated if the mechanical retention of the plate 10 with respect to the ground plane 11 is ensured by other means. The dimensions of the ground plane 11 are generally greater than those of the plate 10. In the example in question in which the antenna is integrated into a smart object intended to be placed on the roof of a motor vehicle, the metal roof of the vehicle can also act as a ground plane, the dimensions of which are very big with respect to the dimensions of the plate 10. The importance of the dimensions of the plate 10 and of the ground plane 11 will be discussed later in the description.

The plate 10 and the ground plane 11 are connected via a power supply wire 12. The power supply wire 12 can for example be, conventionally, a coaxial probe that passes through the ground plane 11 and the dielectric substrate 14 and is connected to the plate 10.

Moreover, the antenna 1 comprises a ground-return wire 13 that connects the plate 10 to the ground plane 11. As will be described in detail below, this ground-return wire 13 acts as a second element radiating at the second working frequency. Preferably, the power supply wire 12 and/or the ground-return wire 13 are arranged substantially perpendicularly to the ground plane. In the case in which the power supply wire 12 and the ground-return wire 13 are both perpendicular to the ground plane 11 and to the plate 10, then they are further arranged substantially in parallel between said ground plane 11 and said plate 10.

More generally, “wire” means a conductor with a given cross-section, not necessarily circular. Namely, the power supply wire 12 and/or the ground-return wire 13 could be a metal strip.

In emission, the antenna 1 converts a voltage or an electric current existing in the power supply wire 12 into an electromagnetic field. This electric power supply is for example ensured by a voltage or current generator 16.

Inversely, in reception, an electromagnetic field received by the antenna 1 is converted into an electric signal that can then be amplified.

In general, a passive antenna can be modelled by a component having a certain impedance seen at the input of the antenna. This a complex impedance, the real part of which corresponds to the “active” part of the antenna, that is to say to a dissipation of the energy by ohmic losses and electromagnetic radiation, and the imaginary part of which corresponds to the “reactive” part of the antenna, that is to say to a storage in the form of electric (capacitive behaviour) and magnetic (inductive behaviour) energy. If at a particular frequency, called resonance frequency, the inductance and the capacitance of the antenna are such that their effects cancel each other out, then the antenna is equivalent to a pure resistor, and if the ohmic losses are negligible the power provided to the antenna is almost entirely radiated. Such a behaviour is observed if the imaginary portion of the antenna is zero.

Moreover, in order to ensure a maximum transfer of power between a source of electric power supply and an antenna, it is necessary to ensure an adaptation of impedance. The adaptation allows to cancel out the reflection coefficient, conventionally noted as $S_{11}$, at the input of the antenna. The reflection coefficient is the ratio between the reflected wave at the input of the antenna and the incident wave. If the adaptation is not ensured, a part of the power is sent back towards the source. In practice, in order to ensure good adaptation of impedance, the antenna must have an impedance equal to that of the transmission line, or in general 50 ohms.

In other words, to obtain an optimal behaviour of the antenna 1 in terms of radiation, it must be ensured that it behaves, for the generator that powers it and at a predetermined resonance frequency, like a load, the real portion of which is close to a determined value, most often 50 ohms, and the imaginary part of which is zero or almost zero. For this purpose, it is routine to insert between the generator 16 and the antenna 1 an electronic circuit for transformation of impedance, called "adaptation circuit" 17, which modifies the input impedance of the antenna 1 seen from the source and ensures the adaptation of impedance. Such an adaptation circuit 17 can for example comprise passive elements such as filters based on inductances and capacitances or transmission lines.

The plate 10 and the ground plane 11 can be compared to a resonant cavity which can be considered, at low frequency, to be a capacitor which stores loads and in which a uniform electric field is created between the ground plane 11 and the plate 10. As long as the distance separating the ground plane 11 and the plate 10 is small compared to the wavelength of the frequencies in question the electric field is oriented according to an axis perpendicular to the horizontal plane containing the ground plane 11. At high frequency, the distribution of the loads on the plate 10 is no longer uniform, and this is also the case for the distribution of the current and that of the electric field. A magnetic field also appears. It is thus known that for particular frequencies, called cavity resonance frequencies, related to the dimensions of the cavity (that is to say related to the dimensions of the plate 10), the distribution of the electric field is such that the radiation of the antenna is optimised. Such frequencies $F_{m,n}$ are defined according to the expression below by pairs (m, n) where m and n are integers greater than or equal to 0, at least one of m or n being non-zero, which represent the cavity modes:

$$F_{m,n} = \frac{c}{2\pi\sqrt{\varepsilon_r}}\sqrt{\left(\frac{m\pi}{L}\right)^2 + \left(\frac{n\pi}{l}\right)^2}$$

an expression in which:

c is the speed of light in a vacuum $\varepsilon_r$ is the relative permittivity for the dielectric substrate 14

L is the length of the plate 10 l is the width of the plate 10

It is thus clear that if it is considered that the relative permittivity is close to 1 (for example in the case in which the dielectric substrate 14 is replaced by the ambient air), for a mode, called fundamental cavity resonance mode, for which m is equal to 1 and n is equal to 0, the resonance frequency is such that half of its wavelength corresponds to the length L of the plate. It should be noted that for the example in question described in reference to FIG. 1, the length L and the width l are both equal to the length of one side of the plate 10 which has a square shape.

Thus, a radiation with a cavity resonance of the electromagnetic type can for example be obtained for a first working frequency of 1575 MHz by using a length of a side of the plate 10 close to 9 cm, or approximately half the wavelength corresponding to this frequency. Other parameters for example such as the distance separating the plate 10 from the ground plane 11 or the value of the permittivity of the dielectric substrate 14 can however influence the length of the plate 10 for which a cavity resonance is obtained. In the example in question for the first aspect, the plate 10 is a square with sides of 8.5 cm. At the first working frequency of 1575 MHz, the antenna 1 thus has a behaviour close to that of a patch antenna. The adaptation of impedance of such an antenna is generally obtained when the power supply wire 12 is positioned at a side of the plate 10 rather than towards its central zone.

Moreover, the plate 10 and the ground-return wire 13 can act as two elements having a radiating behaviour of the electric type. The antenna 1 thus has a behaviour close to that of a wire-plate antenna. The antenna 1 can namely be home to a resonance of the parallel type implementing the ground-return wire 13 and the capacitor formed by the plate 10 and the ground plane 11. This resonance called parallel caused by the ground-return wire 13 occurs at a frequency lower than that of the aforementioned fundamental resonance frequency of the cavity type.

If the shape of the plate 10 is not decisive for this radiation of the electric type, the value of its surface area has an effect on the working frequency. Namely, the smaller the surface area of the plate 10, and the greater the resonance frequency of the wire-plate type. For a square plate 10, the resonance frequency of the wire-plate type is generally such that a quarter of its wavelength is close to the length of a side of the plate 10, but here again other parameters of the structure of the antenna 1 can influence the resonance frequency. In the example in question for the first aspect, a radiation of the electric type is obtained for a second working frequency of 868 MHz.

It should be noted that it would be possible to obtain a greater second working frequency by reducing the surface area of the plate 10, for example by using a plate having a rectangular shape with a length L set with respect to the wavelength of the first working frequency, and by advantageously choosing the width l of the plate to obtain the desired second working frequency.

It should be noted that the two operating modes of the antenna 1 described above are fundamentally different. Indeed, it is a matter on the one hand, at a frequency of 1575 MHz, of a resonance of the electromagnetic type (resonance in patch antenna mode) corresponding to the resonance of a cavity formed by the ground plane 11, the plate 10 and the four imaginary "magnetic walls" connecting the four edges of the plate 10 to the ground plane 11, and on the other hand, at a frequency of 868 MHz, of a resonance of the electric type (resonance in wire-plate antenna mode), that is to say a resonance for which the resonating elements are localised, comparable to electric components (namely, the assembly formed by the ground plane 11 and the plate 10 can be compared to a capacitor while the ground-return wire 13 has an inductance). In the realisation of such an antenna 1, a big difficulty lies in the possibility of adapting the antenna 1 in terms of impedance for the two modes of operations corresponding to two different radiation modes.

Numerous parameters influence the adaptation in terms of impedance of the antenna 1, for example such as the position of the power supply wire 12, that of the ground-return wire 13, the distance separating the power supply wire 12 from the ground-return wire 13, their diameter, etc. It is therefore possible to adjust these various parameters to obtain the best possible adaptation in terms of impedance.

It is also possible to adjust the adaptation circuit 17 to improve this adaptation in terms of impedance. However, the performance of an antenna is generally better if it is adapted in terms of impedance by its actual structure rather than by an adaptation circuit inserted between the generator 16 and the antenna 1.

It turns out to be generally useless to be able to adapt the antenna 1 described above in terms of impedance for the two working frequencies in question by using only the aforementioned parameters and/or by placing an adaptation circuit 17 between the antenna 1 and the generator 16, while keeping reasonable performance of the antenna. This is why an additional capacitive element 15*a* is placed in series with the ground-return wire 13 between the power supply wire 12 and the ground plane 11. As explained above, this involves making it so that the antenna 1 behaves, for the generator 16 which powers it and at a predetermined resonance frequency, like a load, the real part of which is close to a determined value, most often 50 ohms, and the imaginary part of which is zero or almost zero. The capacitive element 15*a* has an impedance that depends on its capacitive value and on the frequency used. It thus modifies the impedance of the antenna 1 and can allow to obtain an adaptation in terms of impedance to the two working frequencies in question. It can namely compensate for the inductance represented by the ground-return wire 13.

It should also be noted that to obtain a resonance of the electric type at the second working frequency, there needs to be an inductive coupling between the power supply wire 12 and the ground-return wire 13. These two wires must therefore be sufficiently close to one another. Nevertheless, it turns out that the adaptation in terms of impedance of the antenna 1 to the first working frequency is better if the power supply wire 12 is positioned at a side of the plate 10 while the ground-return wire 13 must rather be positioned towards the central zone of the plate 10. Indeed, as will be described in detail later in reference to FIG. 8, it is important for the ground-return wire 13 to be positioned towards the middle of the plate 10 to optimise the radiation of the monopolar type with a linear polarisation at the second working frequency.

Moreover, to obtain a resonance of the cavity type at the first working frequency, it is important for the electric current passing through the ground-return wire 13 at this frequency to be as small as possible. This can be favoured by positioning the ground-return wire 13 at a point corresponding to an electric-field node at the first working frequency, that is to say at a point in which the electric field is particularly weak, or even almost zero, at the first working frequency. This is namely the case in the middle of the plate 10.

This relatively significant distance between the power supply wire 12 and the ground-return wire 13 is one of the elements that distinguishes the antenna 1 according to the disclosure from the conventional wire-plate antennas for which this distance must generally be less than one tenth of the wavelength of the working frequency in question, which is not the case for the antenna 1 according to the disclosure.

Preferably, the ground-return wire 13 has a diameter at least four times greater than the diameter of the power supply wire 12.

Figure 2:
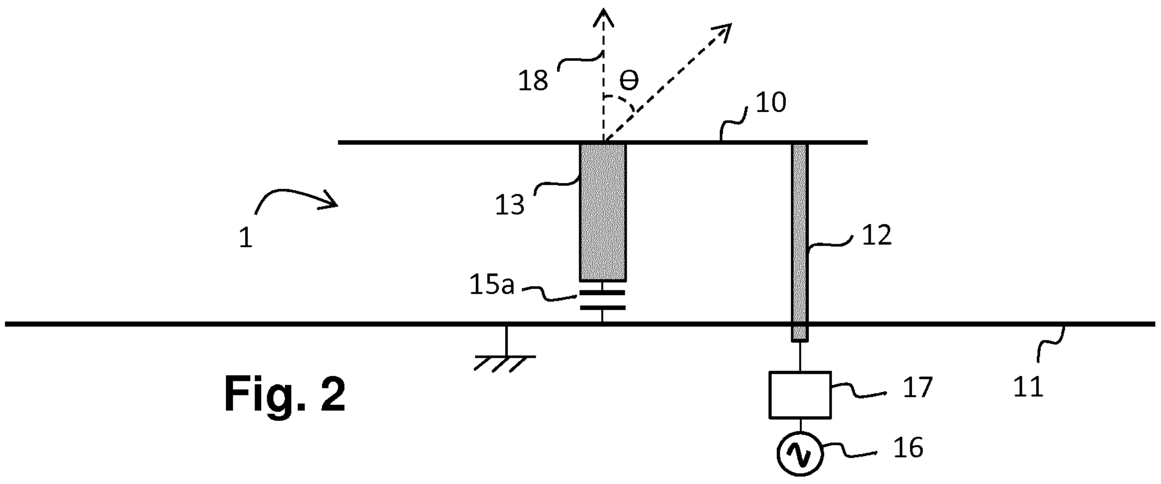
FIG. 2: a diagram, according to a cross-sectional view in a vertical plane, of the first aspect of the antenna.

FIG. 2 schematically shows according to a cross-sectional view in a vertical plane the first aspect of the antenna 1 described above in reference to FIG. 1. This cross-sectional view allows namely to observe that the power supply wire 12 passes through the ground plane 11 to be connected to a generator or to a receiver. It should be noted that the power supply wire 12 must in this case be insulated from the ground plane 11 at the location in which it passes through it.

The capacitive element 15*a* used in this first aspect is a discrete electronic component, for example a capacitor, connected on one side to the ground plane 11 and on the other side to the ground-return wire 13.

FIG. 2 also allows to clarify what is meant by the vertical direction 18. This is the direction upwards perpendicularly to the plane containing the ground plane 11 which is considered horizontal. An angle θ formed between this vertical direction 18 and another direction can thus be defined. This angle will be of interest namely in defining the radiation of the antenna 1 in the various directions of the space.

Figure 3:
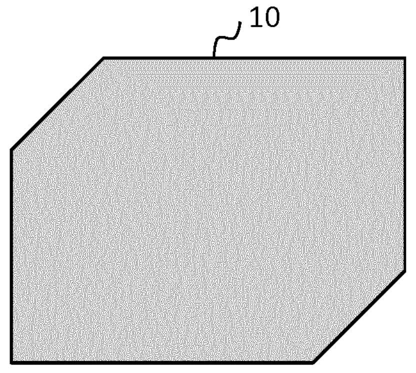
FIG. 3: a diagram of the shape of the plate for the first aspect of the antenna.

FIG. 3 is a diagram of the shape of the plate 10 for a specific aspect of the antenna 1. As indicated above, the polarisation of the electric field of the wave emitted by an antenna of a GPS satellite is a right-hand circular polarisation (RHCP). To obtain such a polarisation for the electromagnetic wave radiated by the antenna 1 at the first working frequency, two opposite angles of the same diagonal of the plate 10 are truncated. In the example in question for the first aspect, the truncated part at each of said angles is an isosceles right triangle, the hypotenuse of which has a length of 25 mm.

It should be noted, however, that there are other means of obtaining a circular polarisation, for example such as by exciting the antenna 1 with two sources phase-shifted by 90°.

Figure 4:
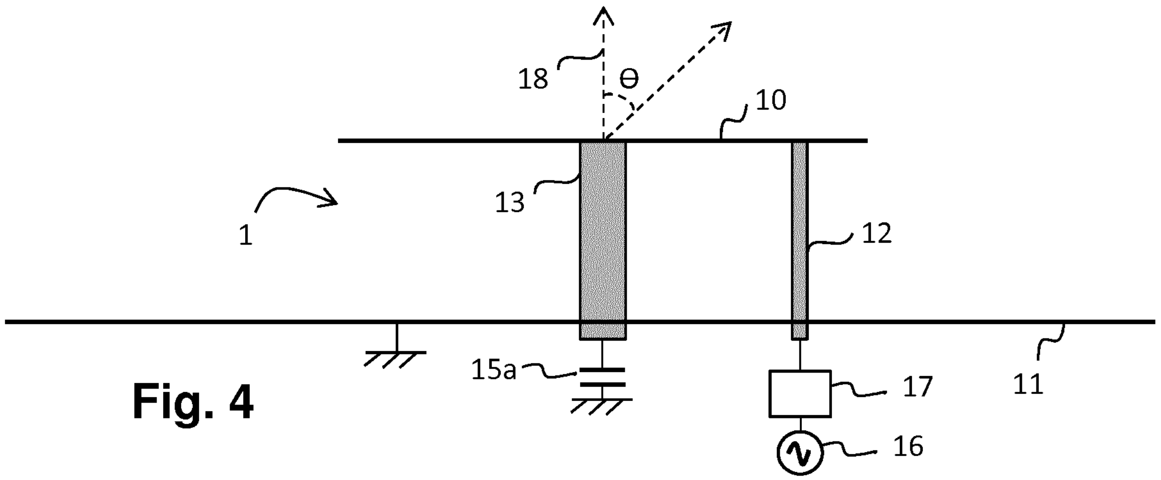
FIG. 4: a diagram of an alternative of the first aspect of the antenna.

FIG. 4 is a diagram of an alternative of the first aspect described in reference to FIGS. 1 to 3 for which the ground-return wire 13 passes through the ground plane 11. In this case, the ground-return wire 13 must be insulated from the ground plane 11 at the location at which it passes through it. The capacitive component 15*a* is thus connected on one side to the ground and on the other side to the end of the ground-return wire 13 which has passed through the ground plane 11. Advantageously, the ground-return wire 13 and/or the power supply wire 12 can thus act as a mechanical support for the plate 10 with respect to the ground plane 11.

The main features of the first aspect of the antenna 1 described above in reference to FIGS. 1 to 4 are given below as an example that is in no way limiting. The plate 10 is a square with sides of 8.5 cm. The distance separating the ground plane 11 from the plate 10 is 10 mm. The dimensions of the ground plane 11 are not decisive, but in the example in question they are approximately three to four times those of the plate 10. The power supply wire 12 has a diameter of 1 mm and it is positioned at the middle of one of the sides of the plate 10, at a distance equal to 10 mm from said side. The ground-return wire 13 has a diameter of 4 mm and it is positioned at the centre of the plate 10. The distance separating the power supply wire 12 from the ground-return wire 13 is therefore approximately 32.5 mm. The value of the capacitive component 15*a* is 21.3 pF. The adaptation circuit 17 is a conventional series/parallel circuit (circuit called "L-shaped") involving an inductance of 12.6 nH and a 2 pF capacitor.

Figure 5:
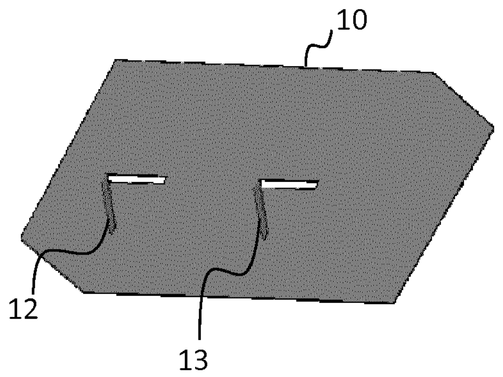
FIG. 5: a diagram of the plate for an alternative of the first aspect of the antenna.

FIG. 5 is a perspective diagram of the plate 10 of the antenna 1 for an alternative of the aspect described in reference to FIG. 4. In this alternative, the power supply wire 12 and the ground-return wire 13 are two metal strips cut out of the plate 10 and folded perpendicularly to the plate. The dimensions of the slots corresponding to the recesses caused by the cutouts in the plate 10 are sufficiently small (for example approximately 3 mm wide) to not have any effect on the performance of the antenna. One aspect of this alternative of particular interest is to simplify the manufacturing of the antenna since it is therefore no longer necessary to connect wires to the plate 10. Indeed, the metal strips act as the power supply wire 12 and the ground-return wire 13 and they are rigidly connected to the plate 10. The metal strips, since they are rigid by nature, can also act as a mechanical support for the plate 10 with respect to the ground plane 11.

Figure 6:
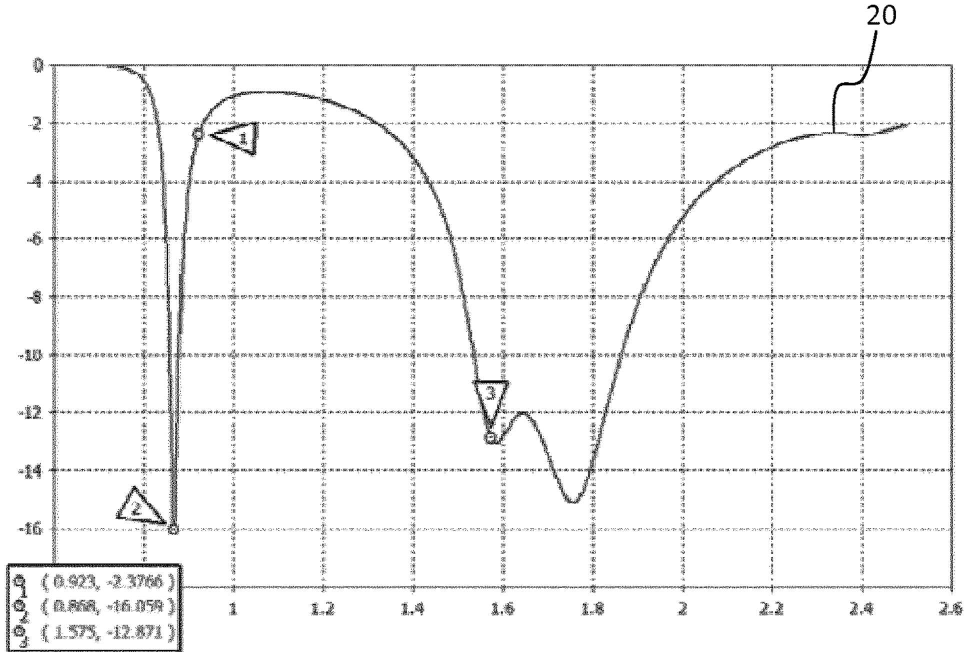
FIG. 6: a diagram showing the reflection coefficient at the input of the antenna for the first aspect.

FIG. 6 is a diagram which shows the reflection coefficient at the input of the antenna 1 for the first aspect described above in reference to FIGS. 1 to 4. In general, the reflection coefficient, conventionally noted as $S_{11}$ and expressed in dB, is the ratio between the reflected wave at the input of an antenna and the incident wave. It depends on the input impedance of the antenna and on the impedance of the transmission line which connects the generator to the antenna.

The curve 20 represents the change in the reflection coefficient $S_{11}$ of the first aspect of the antenna 1 according to the frequency. A resonance frequency corresponding to the first working frequency of 1575 MHz is indicated by the triangular marker n °3. Another resonance frequency corresponding to the second working frequency of 868 MHz is indicated by the triangular marker n °2. Each resonance frequency corresponds to a minimum of the reflection coefficient $S_{11}$. It takes a value close to −13 dB for the resonance at 1575 MHz and a value close to −16 dB for the resonance at 868 MHz. A minimum value of the reflection coefficient generally corresponds to a frequency for which the antenna is adapted in terms of impedance. A typical criterion is to have for example a reflection coefficient of less than −10 dB on the bandwidth of the antenna, that is to say on the frequency band for which the transfer of energy from the power supply to the antenna (or from the antenna to the receiver) is maximum The curve 20 thus allows to confirm that with the features previously listed for the first aspect described in reference to FIGS. 1 to 4, the antenna 1 is adapted in terms of impedance to the two working frequencies in question.

Figure 7:
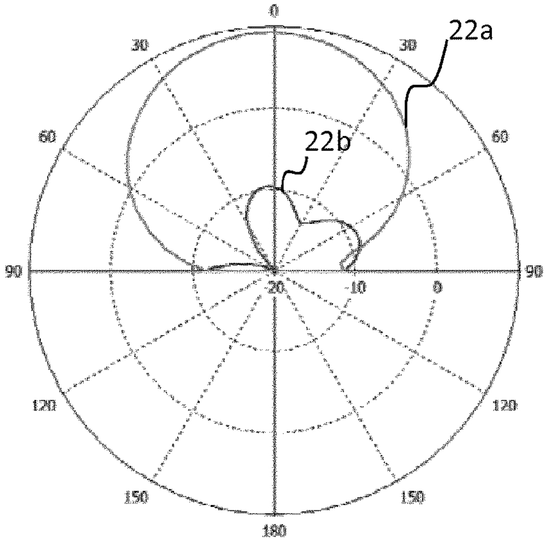
FIG. 7: a radiation diagram according to a vertical cross-sectional plane for the first aspect of the antenna and for a first working frequency.

FIG. 7 represents a radiation diagram according to a vertical cross-sectional plane for the first aspect of the antenna 1 for the first working frequency of 1575 MHz. It represents the variations in the power radiated by the antenna 1 in various directions of the space. It namely indicates the directions of the space in which the power radiated is maximum.

The curve 22*a* corresponds to the radiation according to the right-hand circular polarisation (RHCP). It has a single lobe, the main direction of which is oriented upwards according to the vertical 18 (θ=0°). It is in this direction that the energy emitted or received by the antenna is maximum. The maximum gain is approximately 10 dBi, and a beam width at 3 dB of approximately 60° is observed.

The curve 22*b* corresponds to the radiation according to the left-hand circular polarisation (LHCP). It has a lobe upwards in the vertical direction 18 and another lobe in a direction at 60° to the vertical 18 (θ=60°). For these two directions, the maximum gain is only approximately −10 dBi. Thus, there is gain difference of approximately 20 dB between the RHCP polarisation and the LHCP polarisation upwards in the vertical direction 18. These values allow to obtain good discrimination of the two types of circular polarisations in this direction. The antenna 1 thus has particularly good performance with RHCP polarisation at the first working frequency of 1575 MHz in this vertical direction 18 and upwards. It is thus well adapted to receiving signals coming from satellites of the GPS system.

Figure 8:
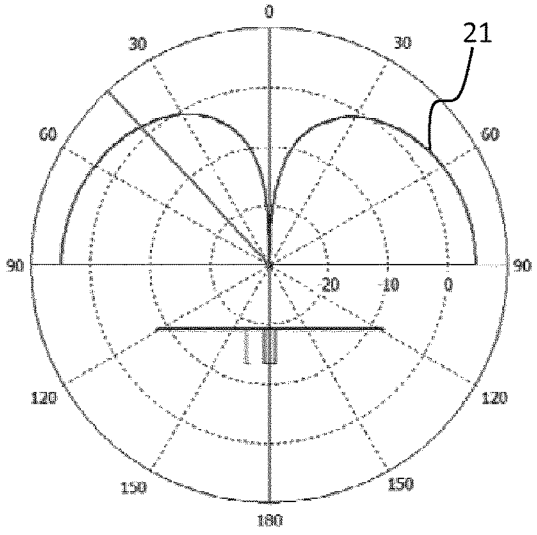
FIG. 8: a radiation diagram according to a vertical cross-sectional plane for the first aspect of the antenna and for a second working frequency.

FIG. 8 shows a radiation diagram according to a vertical cross-sectional plane for the first aspect of the antenna 1 for a second working frequency of 868 MHz.

The curve 21 corresponds namely to the radiation of the antenna 1 at this frequency according to a linear polarisation according to the vertical 18. It signifies an omnidirectional radiation of the monopolar type (that is to say corresponding to the radiation of a monopole). A lobe with rotational symmetry can namely be observed. The radiation is maximum horizontally, that is to say parallel to the ground plane (θ=90°), and it is zero vertically, that is to say perpendicularly to the latter (θ=0°). The antenna has a gain of approximately 5 dBi in the horizontal directions (θ=90°). A loss of more than 3 dB of gain is observed with respect to the maximum gain for angles θ with respect to the vertical 18 less than or equal to approximately 40°. The position of the ground-return wire 13 in the middle of the plate 10 advantageously allows to favour this omnidirectional radiation of the monopolar type with a linear polarisation inscribed in a plane containing the ground-return wire 13 (the electric field of the electromagnetic wave radiated or received by the antenna keeps a fixed direction along the axis of the ground-return wire 13, that is to say, along the vertical 18). The antenna 1 thus has particularly good performance with linear polarisation at the second working frequency of 868 MHz in mainly horizontal directions. It is thus well adapted to emitting signals to an access network of the IoT type operating around this frequency.

It should be noted that the radiation diagrams of FIGS. 7 and 8 only show a radiation in the space located above the ground plane 11 of the antenna 1 (−90°≤θ≤90°. This is due to the fact that the dimensions of the ground plane 11 are sufficiently large with respect to the dimensions of the plate 10 for it to reflect the waves emitted by the antenna upwards. For example the dimensions of the ground plane 11 are at least ten times greater than those of the plate 10, this is namely the case when the roof of the motor vehicle acts as a ground plane.

Figure 9:
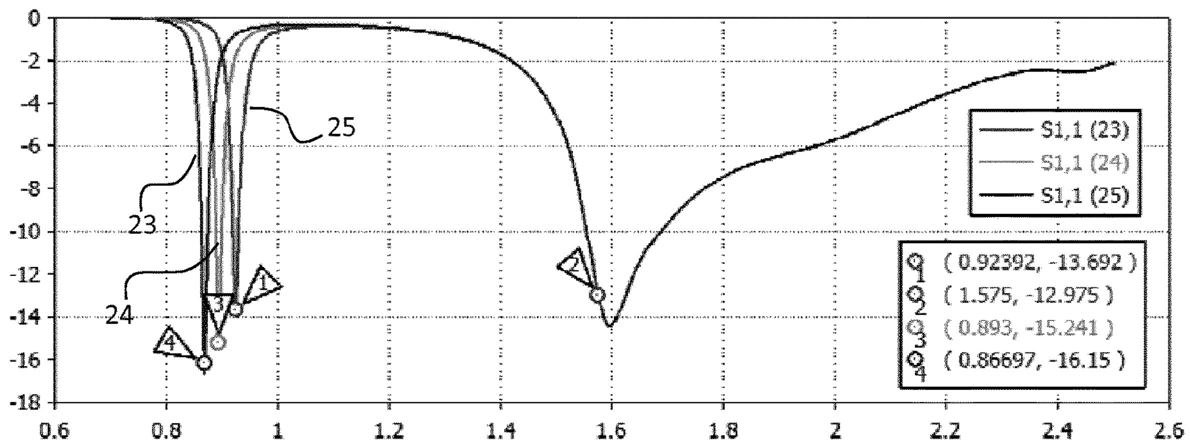
FIG. 9: a diagram representing the reflection coefficient at the input of the antenna for various values of a capacitive element.

FIG. 9 shows the reflection coefficient $S_{11}$ at the input of the antenna 1 for various values of the capacitive component 15*a*.

The curve 23 shows the reflection coefficient $S_{11}$ for a first capacitance value of 21.3 pF for which a resonance of the electric type is obtained for a second working frequency close to 868 MHz (which belongs for example to an ISM frequency band in Europe for the IoT network in question). The triangular marker n °4 indicates a minimum value of $S_{11}$ of less than −16 dB for this frequency.

The curve 24 shows the reflection coefficient $S_{11}$ for a second capacitance value of 17 pF for which a resonance of the electric type is obtained for a second working frequency close to 893 MHz (which belongs for example to an ISM frequency band in the United States for the IoT network in question). The triangular marker n °3 indicates a minimum value of $S_{11}$ of approximately −15 dB for this frequency.

The curve 25 shows the reflection coefficient $S_{11}$ for a third capacitance value of 13.8 pF for which a resonance of the electric type is obtained for a second working frequency close to 923 MHz (which belongs for example to an ISM frequency band in Australia or in Japan for the IoT network in question). The triangular marker n °1 indicates a minimum value of $S_{11}$ of approximately −14 dB for this frequency.

For these three values of the capacitive component 15*a*, a fundamental resonance frequency of the cavity type is always obtained for the first working frequency of 1575

MHz. The triangular marker n °2 indicates a minimum value of $S_{11}$ of approximately −14 dB for this frequency.

Experience shows that it is possible for example to vary the value of the capacitance of the capacitive component 15*a* from 10 pF to 50 pF to obtain a resonance of the electric type for a second working frequency varying between 800 MHz and 1 GHz. The greater the value of the capacitance, and the lower the value of the second working frequency for which a resonance of the electric type is obtained. For this range of values of the capacitance of the capacitive component 15*a* between 10 pF and 50 pF, the operation of the antenna 1 at the first working frequency is not affected. For values of the capacitance of the capacitive component 15*a* lower than 10 pF or greater than 50 pF, it no longer appears possible to adapt the antenna 1 for the two desired radiation modes.

Thus, it is very easy to adapt the manufacturing of an antenna 1 according to the geographic zone in which it is intended to operate. Indeed, it suffices to change the capacitive value of the capacitive component 15*a* to obtain a value of the second working frequency corresponding to the operational frequency of the access network of the IoT type for the geographic zone in question. It is also possible to use a capacitive component 15*a*, the capacitive value of which can be controlled, for example a variable capacitor, a varicap diode (from "variable capacitor", a DTC component (acronym for "Digitally Tunable Capacitor"), or a switch to various capacitors, for a single antenna 1 to be able to operate in various geographic zones in which various working frequencies of the access network of the IoT type are used.

Figure 10:
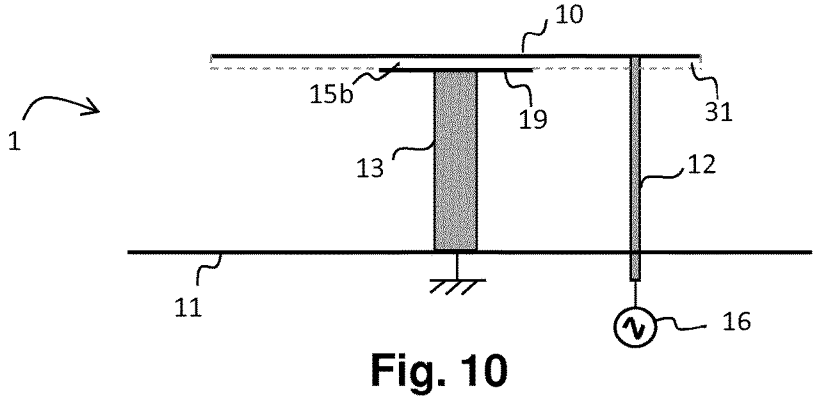
FIG. 10: a diagram, according to a cross-sectional view in a vertical plane, of a second aspect of the antenna.

FIG. 10 is a diagram, according to a cross-sectional view in a vertical plane, of a second aspect of the antenna 1.

In this second specific aspect, the capacitive element 15*b* comprises two electrodes, one electrode of which is a metal plate 19 placed facing the plate 10 which corresponds to the other electrode. The capacitive element 15*b* is therefore here again placed in series with the ground-return wire 13 between the power supply wire 12 and the ground plane 11. In the example illustrated in FIG. 10 for this second aspect, the plate 19 is placed at the end of the ground-return wire 13 which is near the plate 10, but nothing would prevent, according to another example, placing it at the other end of the ground-return wire 13 that is near the ground plane 11 (in this case, it is the ground plane 11, and not the plate 10, which corresponds to the other electrode of the capacitive element 15*b*).

In this second aspect, it is possible for example to use a printed circuit 31 (PCB in English for "Printed Circuit Board"), one face of which is entirely metallised to create the plate 10, and a only a small surface area of the other face of which is metallised to create the lower plate 19 of the capacitive element 15*b*. This allows in particular to facilitate the manufacturing of the antenna 1 since the ground-return wire 13 can thus act as a mechanical support for the printed circuit 31 which comprises both the plate 10 and the capacitive element 15*b*. In the example in question for this second aspect, the plate 19 is a disc 10 mm in diameter and the distance between the plate 19 and the plate 10 is 0.1 mm.

Moreover, in this second aspect, the adaptation in terms of impedance of the antenna 1 is carried out only by adjusting the various parameters of the structure of said antenna. The adaptation circuit 17 of the first aspect described in reference to FIGS. 1 to 4 is thus eliminated.

Figure 11:
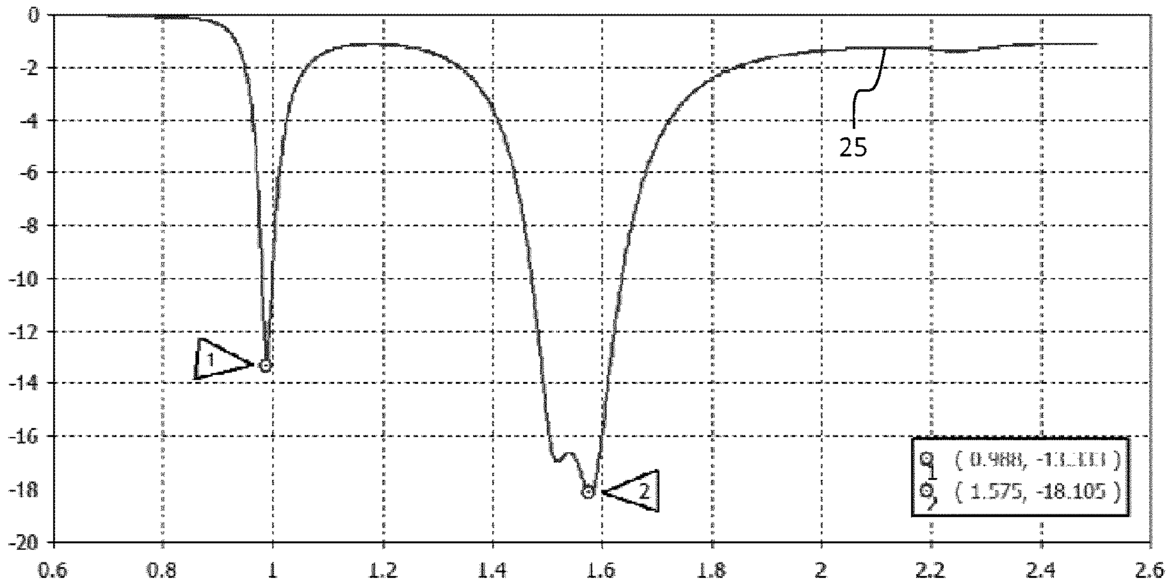
FIG. 11: a diagram showing the reflection coefficient at the input of the antenna for the second aspect.
Figure 12:
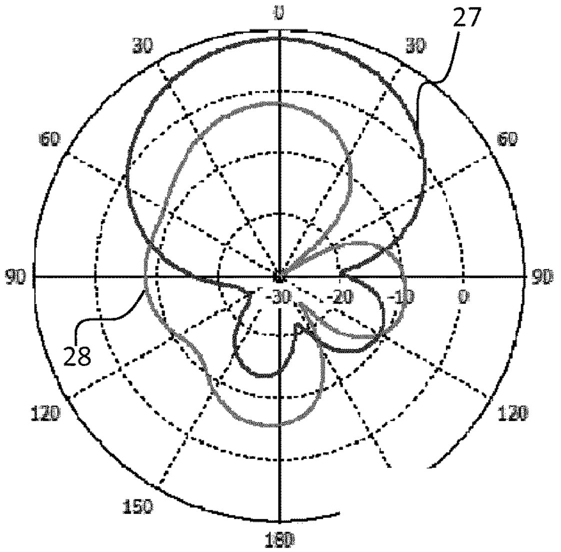
FIG. 12: a radiation diagram according to a vertical cross-sectional plane for the second aspect of the antenna and for a first working frequency.
Figure 13:
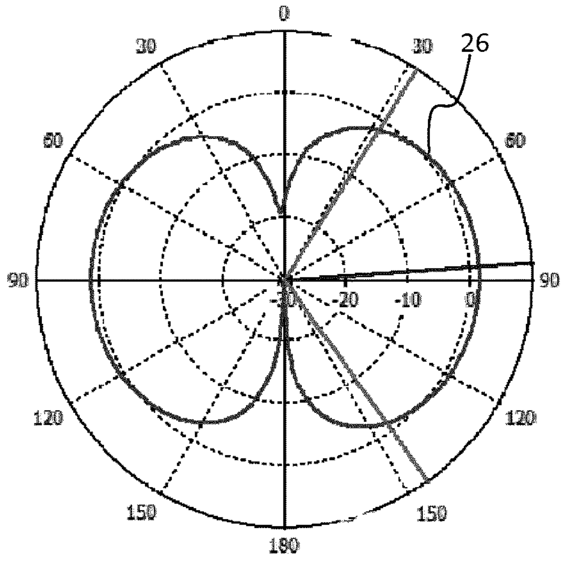
FIG. 13: a radiation diagram according to a vertical cross-sectional plane for the second aspect of the antenna and for a second working frequency.

FIGS. 11, 12 and 13 show, respectively, the reflection coefficient and the radiation diagrams of the antenna 1 according to this second aspect at a first working frequency of 1575 MHz and at a second working frequency close to 988 MHz.

The curve 25 of FIG. 11 shows the reflection coefficient of the antenna 1. In FIG. 12, the curve 27 shows its radiation diagram at 1575 MHz according to an RHCP polarisation while the curve 28 shows its radiation diagram according to an LHCP polarisation. As for the curve 26 of FIG. 13, it shows the radiation diagram of the antenna 1 at 988 MHz according to a vertical linear polarisation.

It should be noted that, contrary to the radiation diagrams of FIGS. 7 and 8, the diagrams of FIGS. 12 and 13 show a radiation in all the space, even in the horizontal plane containing the ground plane 11 of the antenna 1 (90°<θ<270°). This is due to the fact that for the second aspect, the dimensions of the ground plane 11 are not sufficiently large with respect to those of the plate 10 for it to completely reflect the waves emitted by the antenna upwards. However, if it considered that the antenna is placed on the roof of a motor vehicle, then the roof of the vehicle acts as an infinite ground plane, and the radiation observed would exclusively be in the space located above the ground plane.

It appears from these various curves that even if the performance of the antenna 1 according to the second aspect is slightly lesser than that of the antenna 1 according to the first aspect, it remains very satisfactory for the expected operating modes, namely the reception of GPS signals and the emission of messages over an IoT access network.

Indeed, at 1575 MHz the antenna has a coefficient $S_{11}$ of approximately −18 dB and a gain close to 10 dBi in the vertical direction 18 (θ=0°) for the RHCP polarisation. In this direction, the gain is −2 dBi for the LHCP polarisation. The discrimination of the RHCP polarisation with respect to the LHCP polarisation is therefore always possible even if the difference in gain between these two polarisations is smaller than for the first aspect. At 988 MHz, a coefficient $S_{11}$ of approximately −13 dB and a gain close to 2 dBi are observed in the horizontal directions (θ close to 90°).

Figure 14:
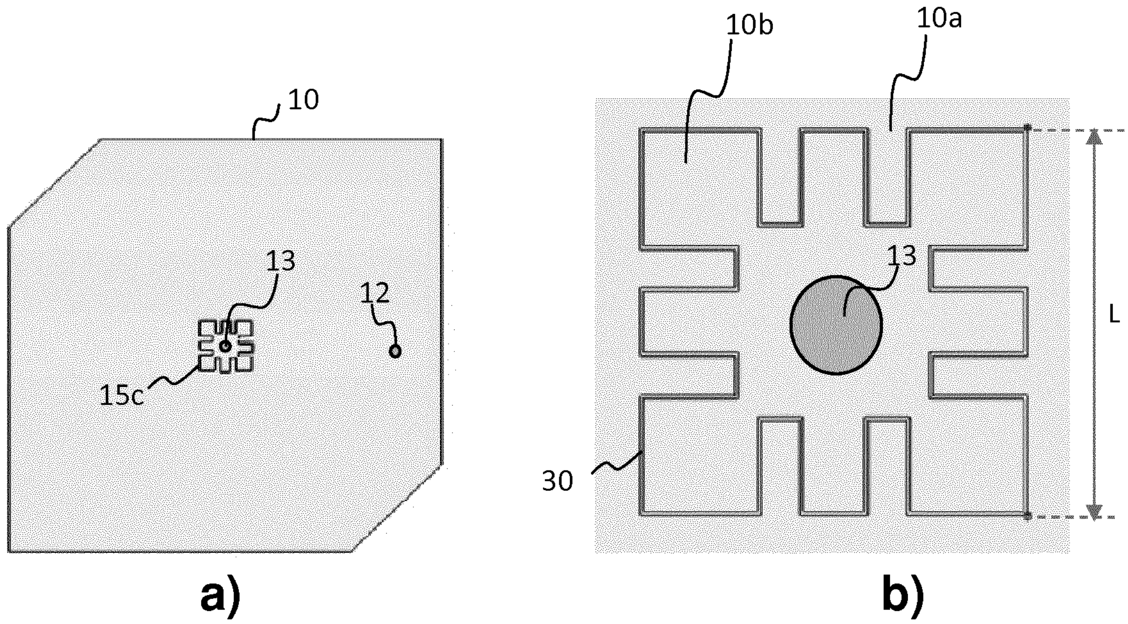
FIG. 14: a diagram of the plate of the antenna for a third aspect.

FIG. 14 shows a third aspect of the antenna 1. Namely, the portion a) of FIG. 14 is a diagram of the plate 10 of the antenna 1 for this third aspect. In this third aspect, a slot 30 is made in the plate 10 so that it completely surrounds the point of connection between the ground-return wire 13 and the plate 10. A capacitive element 15*c* thus appears: one of its electrodes is formed by the portion 10*a* of the plate 10 which is outside of the contour formed by the slot 30, and its other electrode is formed by the portion 10*b* of the plate 10 which is inside said contour formed by the slot 30. Thus, instead of using a discrete electronic component 15*a* or a metal plate 19, the capacitive element 15*c* is made from a slot 30 in the plate 10 at the end of the ground-return wire 13 which is in contact with the plate 10.

The part b) of FIG. 14 is a magnification of the particular shape of the slot 30. In the example in question, the slot 30 is inscribed in a square with sides having the length L equal to 10.2 mm, and the thickness of the slot 30 is 0.2 mm. The particular shape of the slot 30 allows to maximise the value of the capacitance for a given surface area (sometimes in this case this is called "interdigital capacitor"). The dimensions of the slot 30 could vary according to the dielectric substrate 14 used. Thus, it is possible to vary the shape of the slot 30 to obtain various values of capacitances.

It is important to note that the capacitive element 15*c* made from the slot 30 in this third aspect distinguishes the antenna 1 from certain wire-plate antennas of the prior art for which slots are also made in the plate. Indeed, the slot 30 corresponds to a capacitive element 15*c* placed in series with the ground-return wire 13 between the power supply wire 12 and the ground plane 11. Thus, contrary to the wire-plate antennas of the prior art using slots, for the antenna 1 according to the third aspect described in reference to FIG. 14 there is no direct electric connection between the power supply wire 12 and the ground-return wire 13 since the slot 30 completely surrounds the point of connection between the ground-return wire 13 and the plate 10.

Figure 15:
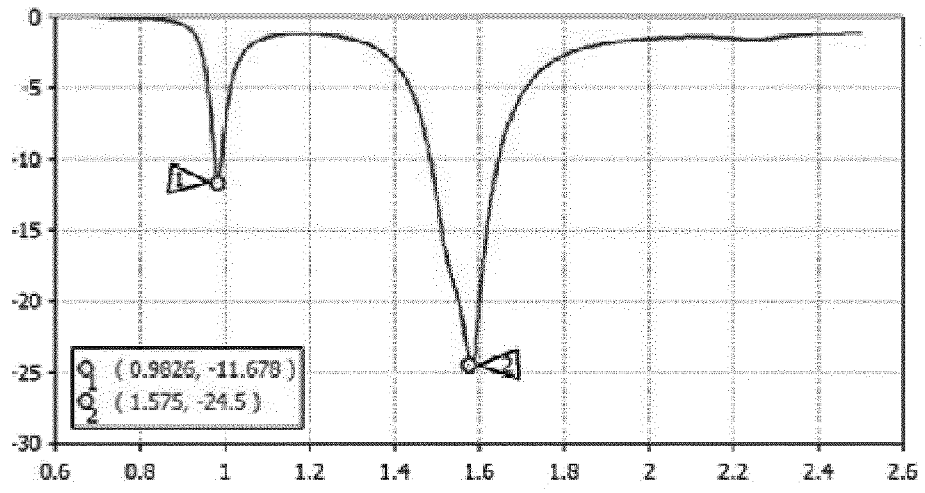
FIG. 15: a diagram showing the reflection coefficient at the input of the antenna for the third aspect, In these drawings, references identical from one drawing to another designate identical or analogous elements. For reasons of clarity, the elements shown are not to scale, unless otherwise mentioned.

FIG. 15 shows the reflection coefficient at the input of the antenna for this third aspect. Therein there are indeed the two resonance frequencies for which the antenna 1 is adapted in terms of impedance. Namely, the marker n °1 indicates the second resonance frequency at around 982 MHz and the marker n °2 indicates the first resonance frequency at 1575 MHz.

The disclosure also relates to an emission device comprising an antenna 1 according to any one of the aspects described above and a generator 16 connected to the power supply wire 12, adapted to form an electric signal at the first working frequency and/or at the second working frequency. For example the generator 16 applies in the power supply wire 12 a voltage or an electric current at the first working frequency and/or at the second working frequency, thus generating an electromagnetic field radiated by the antenna 1. According to other examples, the emission device could also comprise two generators connected to the antenna 1, for example via a duplexer.

The disclosure also relates to a reception device comprising an antenna 1 according to any one of the aspects described above and a receiver connected to the power supply wire 12, adapted to receive an electric signal at the first working frequency and/or at the second working frequency. For example the receiver extracts a signal at the first working frequency and/or at the second working frequency from variations in a voltage or in an electric current induced in the power supply wire 12 by the electric field of an electromagnetic wave received by the antenna 1.

More particularly, the disclosure relates to a transceiver device comprising an antenna 1 according to any one of the aspects described above and allowing to receive, at the first working frequency of the antenna 1, a radioelectric signal comprising geolocation information emitted by a satellite communication system, and to emit to a terrestrial wireless communication system, at the second working frequency of the antenna 1, a radioelectric signal comprising the geographic position of said device optionally accompanied by other information.

These devices namely comprise, conventionally, one or more microcontrollers, and/or programmable logic circuits (of the type FPGA, PLD, etc.), and/or specialised integrated circuits (ASIC), and/or an assembly comprising discrete electronic components, and an assembly of means, considered to be known to a person skilled in the art for carrying out signal processing (analogue or digital filter, amplifier, analogue/digital converter, sampler, modulator, demodulator, oscillator, mixer, etc.).

According to the aspect of the antenna 1 chosen, these devices can comprise or not comprise an adaptation circuit 17 between the transmission line transporting the radiofrequency signal and the antenna. In particular, for the second aspect of the antenna 1 described above in reference to FIG. 10, it is possible to do without such an adaptation circuit since the antenna 1, by its structure itself, is perfectly adapted in terms of impedance to the two working frequencies in question.

The above description clearly illustrates that, by its various features and their advantages, the present disclosure achieves the goals set. In particular, the antenna 1 according to the disclosure allows an operation at two distinct frequencies according to two different modes of radiations and with very satisfactory performance obtained via a good adaptation of impedance to each of the two working frequencies in question. Moreover, the disclosure offers the possibility to easily adjust at least one of the working frequencies by varying the value of the capacitive element (15*a*, 15*b*, 15*c*). Finally, the mechanical structure of the antenna 1 according to the disclosure allows to facilitate its manufacturing and to reduce its bulk with respect to the solutions of the prior art. The cost of manufacturing such an antenna 1 is also reduced.

More generally, it should be noted that the aspects in question above were described as non-limiting examples, and that other alternatives are therefore possible. Namely, different working frequencies can be obtained by varying certain parameters of the antenna for example such as the dimensions of the plate 10, the diameter and/or the position of the power supply wire 12 and of the ground-return wire 13, the value of the dielectric substrate 14, the distance between the plate 10 and the ground plane 11, the value of the capacitive element 15*a*, 15*b*, 15*c*, etc.

Finally, it should be noted that the disclosure has a particularly advantageous use for a device intended to receive signals coming from GPS satellites and to emit information to a wireless communication system of the IoT type, but it could have other uses, for example for communication systems using other frequency bands. Thus, nothing would prevent a device using an antenna 1 according to the disclosure from being configured to emit and receive on each of the two working frequencies of the antenna.

What is claimed is:

1. An antenna comprising a ground plane, a metal plate arranged facing said ground plane, a power supply wire allowing to connect said plate to a generator or a receiver, so that the antenna has a resonance frequency in patch antenna mode, called “first working frequency”, wherein said antenna further comprises:

a ground-return wire connecting the plate to the ground plane, the ground-return wire being arranged substantially perpendicularly to the plate and to the ground plane and positioned substantially in the middle of the plate, and a capacitive element arranged in series with the ground-return wire between the power supply wire and the ground plane, wherein the ground-return wire is an element radiating at a “second working frequency”, lower than said first working frequency, so that the antenna has a resonance frequency in wire-plate antenna mode at said second working frequency.

2. The antenna according to claim 1, wherein the radiation of the antenna at the first working frequency is maximum in a direction perpendicular to the plate, and the radiation of the antenna at the second working frequency is an omnidirectional radiation maximum in a plane parallel to the ground plane.

3. The antenna according to claim 1, wherein the plate is a rectangular plate, two opposite angles of the same diagonal of which are truncated so that the antenna has a circular polarisation at said first working frequency.

4. The antenna according to claim 1, wherein the capacitive element is a discrete electronic component.

5. The antenna according to claim 4, wherein the capacitive component has a controllable capacitive value.

6. The antenna according to claim 1, wherein the capacitive element comprises two electrodes, including one electrode that is formed by a metal plate located at an end of the ground-return wire and arranged facing the plate of the antenna or the ground plane.

7. The antenna according to claim 6, wherein said metal plate of the capacitive element is located at the end of the ground-return wire near the plate of the antenna, so that the other electrode is formed by the plate of the antenna.

8. The antenna according to claim 1, wherein a slot is made in the plate so that said slot completely surrounds the point of connection between the ground-return wire and the plate, and the capacitive element comprises two electrodes, including one electrode that is formed by a part of the plate that is outside of the contour formed by the slot, and the other electrode is formed by another part of the plate that is inside said contour formed by the slot.

9. The antenna according to claim 1, wherein at least one of the ground-return and power supply wires is a metal strip cut out of the plate.

10. The antenna according to 1, wherein the distance between the power supply wire and the ground-return wire is greater than one tenth of the wavelength of the second working frequency.

11. An emission device comprising an antenna according to claim 1 and a generator connected to the power supply wire, adapted to forming an electric signal at the first working frequency and/or at the second working frequency.

12. A reception device comprising an antenna according to claim 1 and a receiver connected to the power supply wire, adapted to receive an electric signal at the first working frequency and/or at the second working frequency.

13. A transceiver device comprising an antenna according to claim 1, configured to receive a signal at the first working frequency comprising geolocation information emitted by a satellite communication system and to emit to a terrestrial wireless communication system a signal at the second working frequency comprising the geographic position of said device.

* * * * *